(12) United States Patent
Moore

(10) Patent No.: US 6,690,224 B1
(45) Date of Patent: Feb. 10, 2004

(54) ARCHITECTURE OF A PLL WITH DYNAMIC FREQUENCY CONTROL ON A PLD

(75) Inventor: Michael T. Moore, Santa Clara, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 240 days.

(21) Appl. No.: 09/893,161

(22) Filed: Jun. 27, 2001

(51) Int. Cl.[7] ............................................... G06F 1/04
(52) U.S. Cl. ........................ 327/296; 327/162; 327/165; 713/501
(58) Field of Search .................... 327/291, 293–299, 327/147, 155–161; 375/376; 331/1 A, DIG. 2, 177 R; 713/501

(56) References Cited

U.S. PATENT DOCUMENTS

| | | | |
|---|---|---|---|
| 4,229,699 A | 10/1980 | Frissell | 327/114 |
| 4,419,629 A | 12/1983 | O'Brien | 327/99 |
| 4,504,862 A | 3/1985 | Achtstaetter | 348/500 |
| 4,893,271 A * | 1/1990 | Davis et al. | 713/501 |
| 4,908,582 A | 3/1990 | Kawano et al. | 331/1 A |
| 4,918,641 A | 4/1990 | Jigour et al. | 708/232 |
| 4,999,526 A | 3/1991 | Dudley | 327/152 |
| 5,046,035 A | 9/1991 | Jigour et al. | 708/232 |
| 5,049,766 A | 9/1991 | van Driest et al. | 327/269 |
| 5,334,952 A * | 8/1994 | Maddy et al. | 331/1 A |
| 5,341,044 A | 8/1994 | Ahanin et al. | 326/41 |
| 5,386,155 A | 1/1995 | Steele et al. | 326/37 |
| 5,491,814 A | 2/1996 | Yee et al. | 713/501 |
| 5,506,982 A | 4/1996 | Hotta et al. | 713/501 |
| 5,510,742 A | 4/1996 | Lemaire | 327/146 |
| 5,528,509 A | 6/1996 | Sawai et al. | 716/1 |
| 5,544,047 A | 8/1996 | Appel | 716/1 |
| 5,570,040 A | 10/1996 | Lytle et al. | 326/41 |
| 5,589,782 A | 12/1996 | Sharpe-Geisler | 326/38 |
| 5,652,536 A | 7/1997 | Nookala et al. | 327/298 |
| 5,670,896 A | 9/1997 | Diba et al. | 326/40 |
| 5,684,434 A * | 11/1997 | Mann et al. | 331/16 |
| 5,710,524 A * | 1/1998 | Chou et al. | 331/1 A |
| 5,740,410 A | 4/1998 | McDermott | 713/501 |
| 5,748,559 A | 5/1998 | Raza et al. | 365/233 |
| 5,757,207 A | 5/1998 | Lytle et al. | 326/39 |
| 5,774,703 A | 6/1998 | Weiss | 713/501 |
| 5,821,794 A | 10/1998 | Nazarian et al. | 327/298 |
| 5,825,226 A | 10/1998 | Ferraiolo et al. | 327/250 |
| 5,875,219 A | 2/1999 | Kim | 375/376 |
| 6,043,677 A * | 3/2000 | Albu et al. | 326/39 |
| 6,054,887 A | 4/2000 | Horie et al. | 327/307 |
| 6,127,865 A * | 10/2000 | Jefferson | 327/149 |
| 6,272,646 B1 | 8/2001 | Rangasayee et al. | 713/500 |

OTHER PUBLICATIONS

RoboClock II™ CY7B994V/CY7B993V, "High–Speed Multi–Phase PLL Clock Buffer", Cypress Semiconductor Corporation, Mar. 6, 2001, pp. 1–14.

Timothy M. Lacey et al., "Programmable Logic Device", U.S. Ser. No. 09/475,879, filed Dec. 30, 1999.

* cited by examiner

Primary Examiner—Minh Nguyen
(74) Attorney, Agent, or Firm—Christopher P. Maiorana, P.C.

(57) ABSTRACT

An apparatus including a clock generating circuit and a programmable logic circuit. The clock generating circuit may be configured to generate one or more output signals in response to a reference signal and one or more control signals, wherein the output signals each have a frequency and a phase that are dynamically variable. The programmable logic circuit may be configured to generate one or more of the control signals and receive the one or more output signals.

18 Claims, 4 Drawing Sheets

ARCHITECTURE OF A PLL WITH DYNAMIC FREQUENCY CONTROL ON A PLD

FIELD OF THE INVENTION

The present invention relates to a method and/or architecture for a programmable logic device (PLD) generally and, more particularly, to a phase lock loop (PLL) with dynamic frequency control on a PLD.

BACKGROUND OF THE INVENTION

Clock signals of a programmable logic device (PLD) can be frequency multiplied, frequency divided and phase shifted using a Phase Lock Loop (PLL) or Delay Lock Loop (DLL). The PLD, the PLL and/or the DLL can be configured using configuration bits stored in memory. Complex programmable logic devices (CPLDs) and field programmable gate arrays (FPGA) use power in proportion to operating frequency. The operating frequency of the CPLD or FPGA can be changed by reconfiguring the PLL or DLL. Currently, the PLL or DLL is configured only when the CPLD or FPGA is programmed or configured (i.e., the configuration bits for PLD and PLL or DLL are written into the memory). Changing the configuration of the PLL or DLL requires that a new programming file be generated. Because the PLL or DLL is configured only when the CPLD or FPGA is programmed, the PLL or DLL is not reconfigurable "on the fly".

SUMMARY OF THE INVENTION

The present invention concerns an apparatus comprising a clock generating circuit and a programmable logic circuit. The clock generating circuit may be configured to generate one or more output signals in response to a reference signal and one or more control signals, wherein the output signals each have a frequency and a phase that are dynamically variable. The programmable logic circuit may be configured to generate one or more of the control signals and receive the one or more output signals.

The objects, features and advantages of the present invention include providing a PLL with dynamic frequency control on a programmable logic device (PLD) that may (i) provide a dynamically controlled skew (phase), (ii) provide improved jitter immunity, (iii) provide dynamic frequency synthesis (through control of multiply and divide values), and/or (iv) provide a PLD for the low-power or handheld markets.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
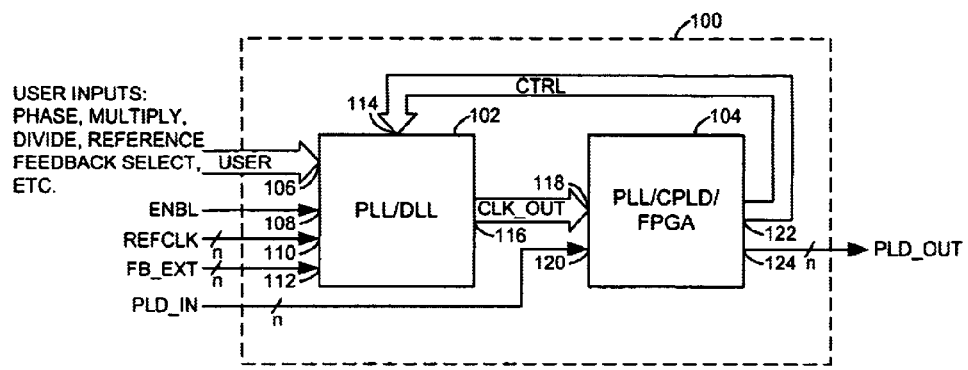
FIG. 1 is a block diagram of a preferred embodiment of the present invention.

Referring to FIG. 1, a block diagram of a circuit 100 illustrating a preferred embodiment of the present invention is shown. The circuit 100 may comprise a circuit 102 and a circuit 104. The circuit 102 may be implemented as a phase lock loop (PLL) circuit with dynamic frequency control capabilities. The circuit 104 may be implemented as, for example, a programmable logic device (PLD), a complex programmable logic device (CPLD), a field programmable gate array (FPGA), or other circuit for implementing user defined logic for a particular application. The circuit 102 may be interfaced to and directly driven by a user defined logic design implemented in the circuit 104.

The circuit 102 may have an input 106 that may receive a signal (e.g., USER), an input 108 that may receive a control signal (e.g., ENBL), an input 110 that may receive a reference signal (e.g., REFCLK), an input 112 that may receive a feedback signal (e.g., FB_EXT), an input 114 that may receive a signal (e.g., CTRL), and an output 116 that may present a signal (e.g., CLK_OUT). The signals USER and CTRL may be used to select between a number of preset modes for each of a multiplier, a divider, and a phase. The multiplier, divider, and phase values are generally independent of one another. For example, the multipliers and dividers of a particular clock signal may be selected from a number of values (e.g., 1, 2, 4, 8, 16, etc.) and the phase of the particular clock signal may be selected from a number of phases (e.g., 45, 90, 135, 180, etc.). Since the multiplier, divider and phase values are generally independent, each may be set to any of the given values of a particular implementation.

The signal USER may comprise a number of signals (e.g., USER(N), where N is an integer). In one example, the signal USER may be a multibit signal. The signal USER may comprise information for determining a phase and/or frequency of one or more output signals. For example, the signal USER may comprise information for selecting one or more multiplier values, one or more divider values, one or more reference signals, one or more feedback signals, one or more phases, and/or other parameters affecting the one or more output signals.

The signal CTRL may comprise a number of signals (e.g., CTRL(N), where N is an integer). In one example, the signal CTRL may be a multibit signal. The signal CTRL may comprise information for determining a phase and/or frequency of one or more of the output signals. For example, the signal CTRL may comprise information for selecting one or more multiplier values, one or more divider values, one or more reference signals, one or more feedback signals, one or more phases, and/or other parameters affecting the one or more output signals.

The signal REFCLK may comprise a number of reference clock signals (e.g., REFCLK(N), where N is an integer). The signal FB_EXT may comprise a number of feedback signals (e.g., FB_EXT(N), where N istan integer). The signal CLK_OUT may comprise a number of clock signals (e.g., CLK_OUT(N), where N is an integer). The clock signals CLK_OUT(N) may have the same or different phases and/or frequencies. The signals USER(N), CTRL(N), REFCLK(N), FB_EXT(N), and CLK_OUT(N) may have the same and/or different values for N.

The circuit 102 may be configured to change a phase and/or frequency of the signal CLK_OUT by changing frequency multiplication, frequency division, reference signals, feedback signals, and/or other operating parameters in response to the signal USER and/or the signal CTRL. The signal ENBL may be used to control the output 116 of the circuit 102. For example, when the circuit 102 is undergoing reconfiguration, the signal CLK_OUT may be disabled in response to a first state of the signal ENBL and re-enabled in response to a second state of the signal ENBL. The user may reconfigure the operating parameters (e.g., frequency, multiplier, divider, phase, etc.) "on the fly" during device operation. The frequency and/or phase of the signal CLK_OUT may be dynamically adjusted in response to one or both of the signal USER and the signal CTRL.

The circuit 102 may be configured such that the operating parameters may be controlled from within the device (e.g., the signal CTRL) or outside of the device (e.g., the signal USER 1o presented via pins, either serially or in parallel). The present invention may (i) reduce and/or eliminate the need to recompile a design, (ii) reduce and/or eliminate the need to reprogram the flash memory or reconfigure the device in any other way, and/or (iii) permit the user to modify the operation of the circuit 100. "on the fly".

The circuit 104 may have an input 118 that may receive the signal CLK_OUT, an input 120 that may receive a signal (e.g., PLD_IN), an output 122 that may present the signal CTRL, and an output 124 that may present a signal (e.g., PLD_OUT). The circuit 104 may be configured to generate the signals CTRL and PLD_OUT in response to the signals CLK_OUT and PLD_IN. In one example, the operation of the circuit 102 may be controlled using a register to store configuration bit values (e.g., by accessing the register through a JTAG port). By writing to the register from within a design implemented using the circuit 104, the user may modify the behavior of the circuit 102 even when the design is running.

Modifying the behavior of the circuit 102 may be useful in generating clock frequency shifts and/or phase shifts on the fly. Since the power consumed by a PLD is generally proportional to the frequency of operation, reducing the PLL output frequency may enable a sleep or low power mode when appropriate. A sleep or low power mode may be useful for handheld or other applications where power use or temperature is important.

Figure 2:
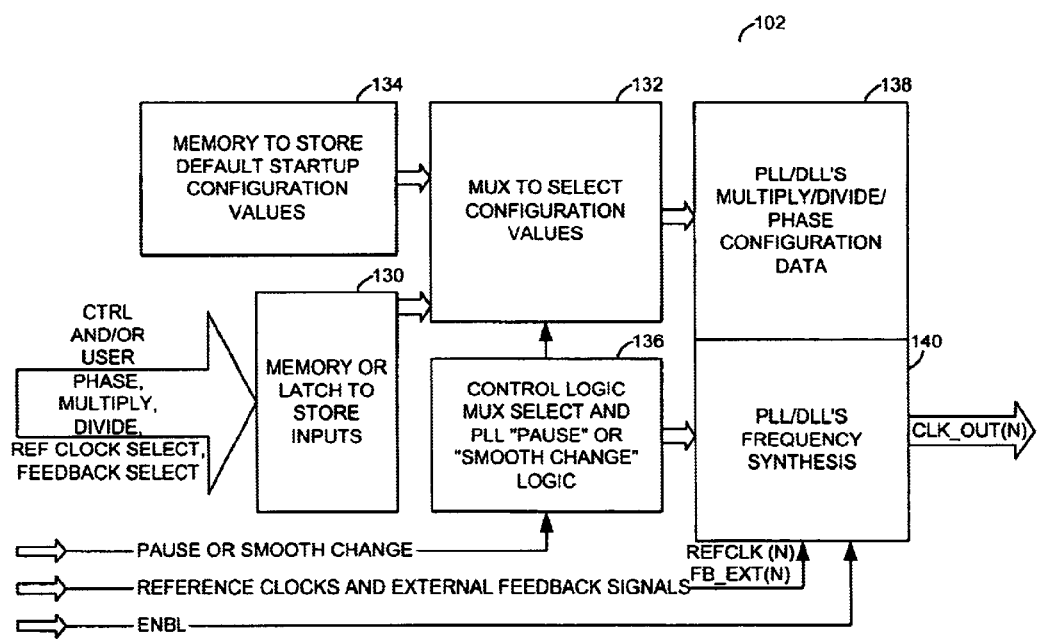
FIG. 2 is a detailed block diagram of the circuit of FIG. 1.

Referring to FIG. 2, a more detailed block diagram of the circuit 102 is shown. The circuit 102 may comprise a storage element (circuit) 130, a multiplexing circuit 132, a storage element (circuit) 134, a control logic circuit 136, a configuration circuit 138, and a frequency synthesis circuit 140. The storage circuits 130 and 134 may be implemented using, for example, volatile or non-volatile memory devices, latches, or registers. The frequency synthesis circuit 140 may be implemented as, for example, a PLL circuit or a DLL circuit.

The signal CTRL and/or the signal USER may be presented to an input of the circuit 130. The circuit 130 may be configured to store the states of the signal CTRL and/or the signal USER. The circuit 130 may have an output that may present the stored information to a first input of the circuit 132.

The circuit 134 may be configured to store default startup configuration information. The circuit 134 may be programmed at the same time the PLD 104 is configured. The circuit 134 and the PLD 104 may be programmed in response to a configuration bitstream containing default startup values. Possible sources of the default configuration values may include, but are not limited to, a FLASH or similar device, a microprocessor or similar device performing embedded programming (e.g., through a JTAG port), a computer configured to program the CPLD through the JTAG port (e.g., via a cable), or any other variation. The circuit 134 may have an output that may present the default configuration information to a second input of the circuit 132. The circuit 132 may be configured to select either the default configuration information or the user input information for presentation at an output in response to a control signal received from the control logic circuit 136. An output of the circuit 132 may present a signal (e.g., the default configuration information or the user input information) to an input of the circuit 138.

The circuit 136 may be configured to receive one or more control signals (e.g., PAUSE , SMOOTH, etc.). The circuit 136 may be configured to control the circuits 132 and 140 in response to the signals PAUSE and SMOOTH. For example, the signal PAUSE may be configured to gracefully stop the circuit 102 to reduce power consumption. The signal SMOOTH may be configured to control a smooth frequency change of the signal CLK_OUT. The circuit 136 may have a first output that may present one or more control signals to the circuit 132 and a second output that may present one or more control signals to the circuit 140 in response to the signal PAUSE and/or the signal SMOOTH. The circuit 136 may also be configured to provide a step function where the output of the circuit 102 may be disabled (e.g., tri-stated) while the circuit 102 is reconfigured (e.g., frequency and/or phase of the signal CLK_OUT changed) and re-enabled when the signal CLK_OUT is at the new configuration.

The circuit 138 may be configured to present the multiply, divide, and/or phase configuration information (data) received from the circuit 132 to the frequency synthesis circuit 140. The circuit 140 may have an input that may receive the reference signal REFCLK, an input that may receive the feedback signal FB_EXT, and a control input that may receive the signal ENBL. The circuit 140 may be configured to generate the signal CLK_OUT in response to the signals REFCLK, FB_EXT, ENBL, one or more control signals received from the circuit 136 and the multiply, divide, and phase configuration data received from the circuit 138.

Figure 3:
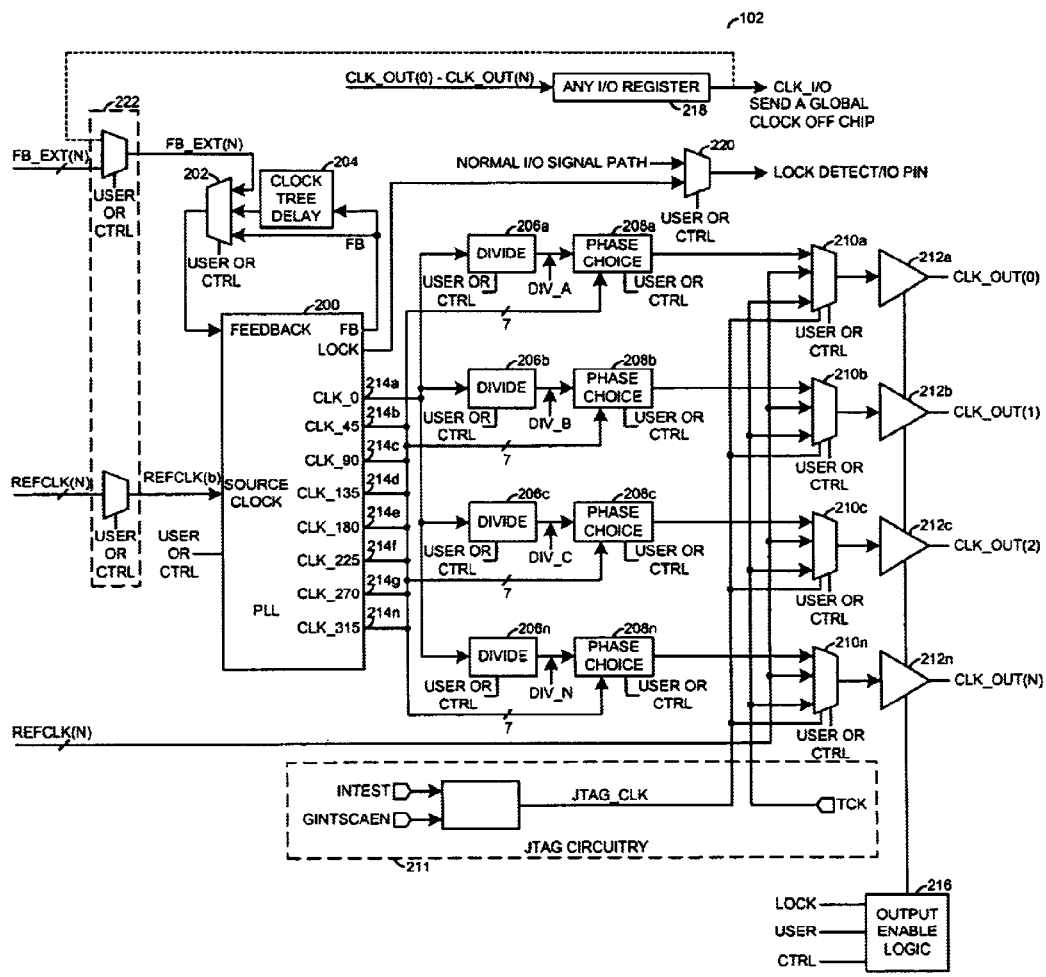
FIG. 3 is a more detailed block diagram illustrating an example implementation of the circuit of FIG. 2.

Referring to FIG. 3, a detailed block diagram of the circuit 102 is shown. The circuit 102 may comprise a phase lock loop (PLL) 200, a multiplexer 202, a delay circuit 204, a number of dividers 206a–206n, a number of intermediate multiplexers 208a–208n, a number of output multiplexers 210a–210n, a JTAG circuitry block 211, and a number of tristatable buffers 212a–212n. The JTAG circuitry block 211 may be configured to generate a control signal (e.g., JTAG_CLK) in response to one or more JTAG signals (e.g., INTEST and GINTSCEN). The circuit 102 may be configured to present a JTAG clock signal (e.g., TCK) in response to the signal JTAG_CLK.

A signal selected from one or more reference signals (e.g., REFCLK(0)) may be presented to an input of the PLL 200. The PLL 200 may have (i) a number of outputs 214a–214n that may present a number of output signals (e.g., CLK_0, CLK_45, CLK_90, CLK_135, CLK_180, CLK_225, CLK_270, CLK_315, etc.), each having different phases. The signals CLK_0, CLK_45, CLK_90, CLK_135, CLK_180, CLK_225, CLK_270, CLK_315 may be generated in response to the signal REFCLK(0), a feedback signal, the signal USER and/or the signal CTRL. The feedback signal may be (i) the signal FB_EXT (or a selected one of the signals FB_EXT(N)), (ii) an output signal (e.g., FB) or (iii) a signal generated by the clock delay circuit 204 in response to the signal FB. The feedback signal may be selected in response to the signal USER and/or the signal CTRL using the multiplexer 202. The PLL 200 may be configured to multiply the frequency of the signal REFCLK (0) by a multiplier factor (e.g., 1, 2, 4, etc.) selected in response to the signal USER and/or the signal CTRL. The PLL 200 may have an output that may present a status signal (e.g., LOCK) that may indicate when the PLL is locked.

The signal CLK_0 may be presented to the dividers 206a–206n. Each of the dividers 206a–206n may be configured to generate a respective signal (e.g., DIV_A-DIV_N) by dividing the signal CLK_0 by a division factor (e.g., 1, 2, 3, 4, 5, 6, 8, 16, etc.) selected in response to either the signal USER or the signal CTRL. The signals DIV_A-DIV_N may be presented to an input of the multiplexers 208a–208n, respectively. Each of the intermediate multiplexers 208a–208n may have an input that may receive the signals CLK_45, CLK_90, CLK_135, CLK_180, CLK_225, CLK_270, and CLK_315.

The multiplexers 208a and 210a may work in cooperation to select, in one example, one of the signals DIV_A, CLK_45, CLK_90, CLK_135, CLK_180, CLK_225, CLK_270, CLK_315, TCK, and REFCLK(0) as the signal CLK_OUT(0) in response to the signal USER and/or the signal CTRL, the signal INTEST, and the signal GINTSCEN. The multiplexers 208b and 210b together may select, in one example, one of the signals DIV_B, CLK_45, CLK_90, CLK_135, CLK_180, CLK_225, CLK_270, CLK_315, TCK, and REFCLK(1) as the signal CLK_OUT(1) in response to the signals, USER, CTRL, INTEST, and GINTSCEN. The multiplexers 208c and 210c may select, in one example, one of the signals DIV_C, CLK_45, CLK_90, CLK_135, CLK_180, CLK_225, CLK_270, CLK_315, TCK, and REFCLK(2) as the signal CLK_OUT(2) in response to the signals, USER, CTRL, INTEST, and GINTSCEN. The multiplexers 208n and 210n may select, in one example, one of the signals DIV_N, CLK_45, CLK_90, CLK_135, CLK_180, CLK_225, CLK_270, CLK_315, TCK, and REFCLK(N) as the signal CLK_OUT(N) in response to the signals USER, CTRL, INTEST, and GINTSCEN.

An output of the multiplexers 210a–210n may present the signals CLK_OUT(0)-CLK_OUT(N) to a respective input of the tristate buffers 212a–212n. The tristate buffers 212a–212n may be configured to present the signals CLK_OUT(0)-CLK_OUT(N) at an output in response to an output control signal. The output control signal may be presented by an output enable logic block 216 to a control input of the buffers 212a–212n. The output enable logic block 216 may be configured to generate the output control signal, in one example, in response to one or more of the signals USER, CTRL, and LOCK.

The signal FB_EXT may be used, in one example, as a board de-skew reference. When the signal FB EXT is used as a de-skew reference, one of the output clock signals (e.g., CLK_OUT(0)-CLK_OUT(N)) may be presented from a macrocell (or I/O cell) 218 as the signal CLK_I/O and returned via an external circuit as the signal FB_EXT. The macrocell 218 may be configured to select the signal CLK_OUT(0), the signal CLK_OUT(1), the signal CLK OUT(2), or the signal CLK_OUT(N) as an output clock signal (e.g., CLK-I/O) for presentation to a bonding pad. The circuit 102 may have a multiplexer 220 that may select the signal LOCK or a normal I/O signal for presentation to a bonding pad in response to the signal USER and/or the signal CTRL. The circuit 102 may have a multiplexer block 222 that may be configured to select the reference and feedback signals used to generate the signals CLK_OUT(0)-CLK_OUT (N) in response to the signal USER and/or the signal CTRL.

Figures 4, 6:
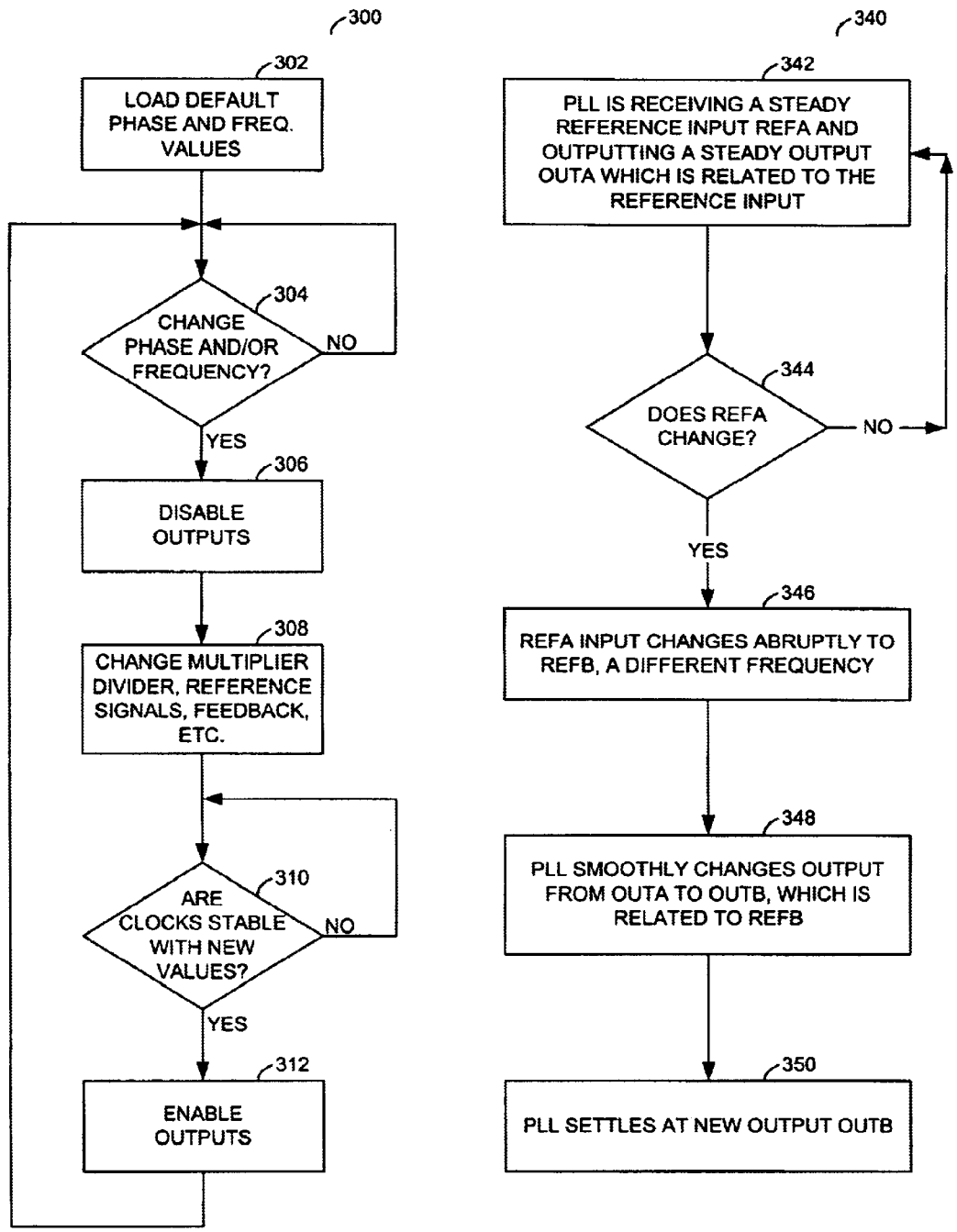
FIG. 4 is a flow diagram illustrating an example operation of the present invention.
FIG. 6 is a flow diagram illustrating an example operation of the present invention.

Referring to FIG. 4, a flow diagram 300 illustrating an example operation in accordance with the present invention is shown. A default configuration may be loaded into the circuit 102 (e.g., the block 302). The circuit 102 may operate with the default values until a change is selected (e.g., the block 304). When a change in phase or frequency is desired, the circuit 102 may be configured to disable the output clock signals before changing to a new multiplier, divider, phase, reference signal, feedback signal, etc. (e.g., the block 306). The user may modify the configuration bits (re-configure the circuit 102), in one example, by writing a value into a register, latch, or memory (e.g., the block 308). For example, the user may write to the configuration register and increase the multiplier value from an initial value to a new value (e.g., from 1 to 2). When the configuration is changed, the circuit 102 may lose lock. When the circuit 102 reacquires lock, a lock indication may be given and the output signals enabled (e.g., the blocks 310 and 312).

When lock is lost, the behavior of the circuit 102 may be erratic. For example, the clock may continue to run, but the output signal may ramp quickly from the old frequency to the new frequency. By disabling the signal CLK_OUT, any erratic clock outputs may be prevented from driving the design in the circuit 104.

Figure 5A:
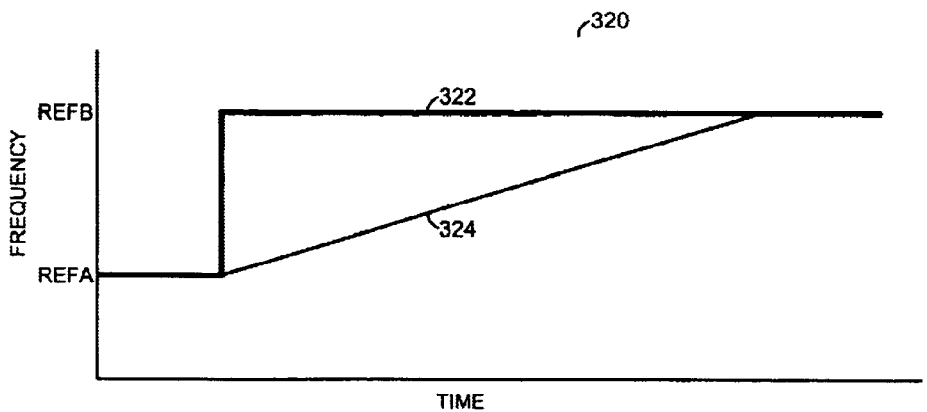
FIG. 5A is a timing diagram illustrating a slew limiting operation in accordance with the present invention.

Referring to FIG. 5A, a timing diagram 320 is shown 10 illustrating an example operation of the present invention. The circuit 102 may be configured to provide a smooth change in both frequency and phase as the multiply, divide and phase options are modified in response to either external signals (e.g., the signal USER) and/or the control signals generated by the circuit 104 (e.g., the signal CTRL). For example, the circuit 102 may be configured to provide a slew rate limiting function. When the reference input (e.g., the signal REFCLK) changes from a first frequency to a second frequency (e.g., the trace 322) or from a first reference (e.g., REFCLK(1)) to a second reference (e.g., REFLCK(2)), the circuit 102 may be configured to ramp from one frequency to another (e.g., the trace 324).

Figure 5B:
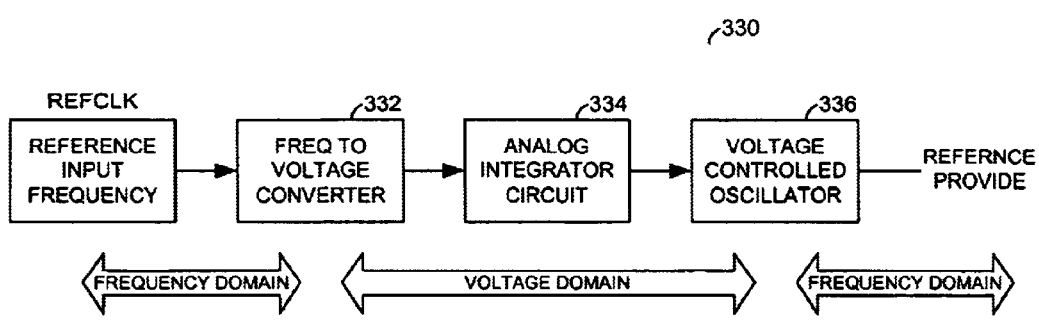
FIG. 5B is a block diagram of a circuit for limiting a slew rate in accordance with the present invention.

Referring to FIG. 5B, a block diagram of a circuit 330 is shown. The circuit 330 may be implemented as a slew limiting circuit. The circuit 330 may be configured to couple the signal REFCLK to the circuit 102. The circuit 330 may be configured to smooth an abrupt change in input frequency (e.g., the signal REFCLK changes from a first frequency to a second frequency or the input selection changes from a first reference REFCLK(1) to a second reference REFLCK(2)). The circuit 330 may comprise a circuit 332, a circuit 334, and a circuit 336. The circuit 332 may be implemented as a frequency-to-voltage converter. The circuit 334 may be implemented as an analog integrator circuit. The circuit 336 may be implemented as a voltage controlled oscillator.

The input reference signal may be presented to an input of the circuit 332. The circuit 332 may be configured to generate an output voltage that is proportional to the frequency of the input reference signal. The output of the circuit 332 may be presented to an input of the circuit 334. The circuit 334 may be configured to generate a smooth voltage ramp that is proportional to the step voltage from the circuit 332. The smooth voltage ramp generated by the circuit 334 may be presented to an input of the circuit 336. The circuit 336 may be configured to generate a smooth frequency ramp in response to the smooth voltage ramp. The output of the circuit 336 may be presented to the circuit 102 as the signal REFCLK. The circuit 102 generally generates an output that ramps smoothly from one value (related to the initial reference input) to another value (related to the new reference input).

Referring to FIG. 6, a flow diagram 340 is shown illustrating an example operation of the present invention. As long as the circuit 102 receives a steady reference input, the circuit 102 generally presents a steady output (e.g., the block 342 and the block 344). When the reference input changes (e.g., the block 346)., the output of the circuit 102 generally changes smoothly to a new output (e.g., the block 348). When the reference input is again steady, the circuit 102 generally settles at the new output (e.g. (the block 350).

The present invention may provide a method for dynamically modifying the output frequency and/or phase (skew) of a PLL/DLL on a PLD. The present invention may enable dynamic reconfiguration of the multiply, divide and phase shift (skew) values of the PLL by logic implemented in the PLD. The PLL may be configured to provide a smooth change from an initial frequency to a new frequency when a multiply and/or divide value changes, or a reference input changes (e.g., from one reference to another). The PLL may be configured to provide a smooth slew of an output waveform as phase value changes. The user may control operation of the PLL via one or more inputs signals that may change during device operation. The present invention may be configured, for example, to ramp the frequency up or down, and/or trade power versus speed of operation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a clock generating circuit configured to generate one or more output signals in response to a reference signal and one or more control signals, wherein said output signals each have a frequency and a phase that are dynamically variable;
   a programmable logic circuit configured to generate one or more of said control signals and receive said one or more output signals; and
   a plurality of tri-statable buffers coupling said output signals of said clock generating circuit to said programmable logic circuit, wherein said clock generating circuit is configured to (i) receive said one or more control signals (a) from an external source when in a first mode, (b) internally from said programmable logic circuit when in a second mode, and (c) from both said external source and internally from said programmable logic circuit when in a third mode and (ii) said tri-statable buffers are configured to present said output signals to said programmable logic circuit when said clock generating circuit is in a locked state.

2. The apparatus according to claim 1, wherein a default frequency and a default phase is set for each of said one or more output signals in response to configuration information stored within said apparatus.

3. The apparatus according to claim 1, wherein said programmable logic circuit is configured to adjust said frequency and/or phase in response to predetermine criteria for power conservation.

4. The apparatus according to claim 1, wherein said programmable logic circuit comprises a device selected from the group consisting of a programmable logic array, a complex programmable logic device, and a field programmable gate array.

5. The apparatus according to claim 1, wherein said clock generating circuit comprises a phase lock loop (PLL).

6. The apparatus according to claim 1, wherein said clock generating circuit comprises a delay lock loop (DLL).

7. The apparatus according to claim 1, wherein said one or more control signals are generated in response to information stored in a configuration register of said apparatus.

8. The apparatus according to claim 7, wherein said configuration register is accessible via a JTAG port.

9. The apparatus according to claim 1, wherein said one or more control signals are generated in response to one or more external signals.

10. An apparatus comprising:
    means for generating one or more output signals in response to a reference signal and one or more control signals, wherein said output signals each having a frequency and a phase that is dynamically variable; and
    means for implementing user defined logic configured to generate said one or more control signals and receive said one or more output signals, wherein said phase of said output signals is varied by selecting one of a plurality of phases from a multi-phase phase lock loop.

11. A method for dynamically changing a frequency and/or phase of a clock signal on a programmable logic device comprising the steps of:
    (A) generating one or more output signals in response to a reference signal and one or more control signals, wherein said output signals each have a frequency and a phase that are dynamically variable;
    (B) receiving said one or more of output signals; and
    (C) generating one or more of said control signals in response to one or more predetermined logic expressions, wherein said phase of said output signals is varied by selecting one of a plurality of phases from a multi-phase phase lock loop.

12. The method according to claim 11, wherein the step (A) comprises the sub-step of:
    storing a default phase and frequency for said one or more output signals.

13. The method according to claim 11, wherein the step (A) further comprises the sub-step of:
    selecting a phase and/or frequency for one or more of said output signals that is different from said default value based on said one or more control signals.

14. The method according to claim 13, wherein said output signals are enabled in response to a lock signal.

15. The method according to claim 11, wherein the step (A) comprises the sub-steps of:
    disabling said one or more output signals;
    changing said phase and/or frequency of one or more of said output signals; and
    enabling said one or more output signals.

16. The method according to claim 11, wherein said frequency of said output signals is varied by changing multiplier values of a phase lock loop.

17. The method according to claim 11, wherein said frequency of said output signals is varied by changing a divider value.

18. The method according to claim 11, wherein said phase of said output signals is varied by changing a delay value of a delay lock loop.

* * * * *